United States Patent
Nguyen et al.

(10) Patent No.: US 9,844,023 B2
(45) Date of Patent: Dec. 12, 2017

(54) SYSTEM AND METHOD TO SILENCE OTHER DEVICES IN RESPONSE TO AN INCOMING AUDIBLE COMMUNICATION

(71) Applicant: EchoStar Technologies L.L.C., Englewood, CO (US)

(72) Inventors: Phuc H. Nguyen, Parker, CO (US); Christopher William Bruhn, Aurora, CO (US)

(73) Assignee: ECHOSTAR TECHNOLOGIES L.L.C., Englewood, CO (US)

( * ) Notice: Subject to any disclaimer, the term of this patent is extended or adjusted under 35 U.S.C. 154(b) by 0 days.

(21) Appl. No.: 14/506,275

(22) Filed: Oct. 3, 2014

(65) Prior Publication Data

US 2016/0100379 A1    Apr. 7, 2016

(51) Int. Cl.
*H04W 68/02*    (2009.01)
*H03G 3/32*    (2006.01)

(52) U.S. Cl.
CPC .............. *H04W 68/02* (2013.01); *H03G 3/32* (2013.01)

(58) Field of Classification Search
CPC ..... H04M 11/00; H04M 1/82; H04L 12/2827; H04L 2012/2849; H04W 68/02; H04W 68/00; H03G 3/20
USPC .......................................................... 455/458
See application file for complete search history.

(56) References Cited

U.S. PATENT DOCUMENTS

| | | | | |
|---|---|---|---|---|
| 5,528,673 | A * | 6/1996 | Rosenthal | H04M 11/00 379/102.03 |
| 8,836,502 | B2 * | 9/2014 | Culbert | H04M 1/72569 340/539.22 |
| 2009/0167542 | A1 * | 7/2009 | Culbert | H04M 1/72569 340/635 |
| 2009/0197524 | A1 * | 8/2009 | Haff | H04L 12/2827 455/3.06 |
| 2014/0333323 | A1 * | 11/2014 | Kabler | G01R 31/2836 324/511 |

* cited by examiner

*Primary Examiner* — Vladimir Magloire
*Assistant Examiner* — Donald H Braswell
(74) *Attorney, Agent, or Firm* — Seed IP Law Group LLP (57) ABSTRACT

A user's set top box detects the ringing of a telephone, mobile device or other type of audible notification of an incoming contact and, in response, sends a command causing a current audio level of the television programming or other media currently being played to decrease such that the audible notification can be heard by the user. A device silencing manager on the set top box may detect the audible notification occurring by the sound waves of the audible notification from the mobile device picked up by a microphone of the receiving device. Additionally or alternatively, a device silencing manager on the set top box may wirelessly receive, either directly or indirectly from the mobile device, an electronic notification of the audible notification.

33 Claims, 6 Drawing Sheets

SYSTEM AND METHOD TO SILENCE OTHER DEVICES IN RESPONSE TO AN INCOMING AUDIBLE COMMUNICATION

BRIEF SUMMARY

People often watch television or listen to music at a volume level which makes it difficult to hear their phone ringing. For example, an audible notification of an incoming contact, such as the ringing of their mobile device or an audio alert of an incoming message, may be missed if the volume level of the TV is too high compared to the volume level of the audible notification of the incoming call or message on their mobile device.

To solve this, in one embodiment, a device silencing manager on the user's set top box detects the ringing of the telephone or mobile device or other type of audible alert and decides whether to cause a current audio level of the television programming to decrease such that the audible notification can be heard by the user. The device silencing manager may detect the audible notification occurring by the sound waves of the audible notification from the mobile device picked up by a microphone of the receiving device. Additionally or alternatively, the device silencing manager may receive an electronic notification of the audible notification received either directly from the mobile device over a short range wireless network or other communication channel. If it is decided by the device silencing manager to cause the current audio level of the television programming to decrease, then it sends a signal, such as a command, causing the current volume level of the television programming being presented to decrease or be muted. For example, this may be sending a volume control signal from the device silencing manager to the television, which may have built in speakers for audio output.

BRIEF DESCRIPTION OF THE DRAWINGS

The components in the drawings are not necessarily to scale relative to each other. Like reference numerals designate corresponding parts throughout the several views.

DETAILED DESCRIPTION

Figure 1:
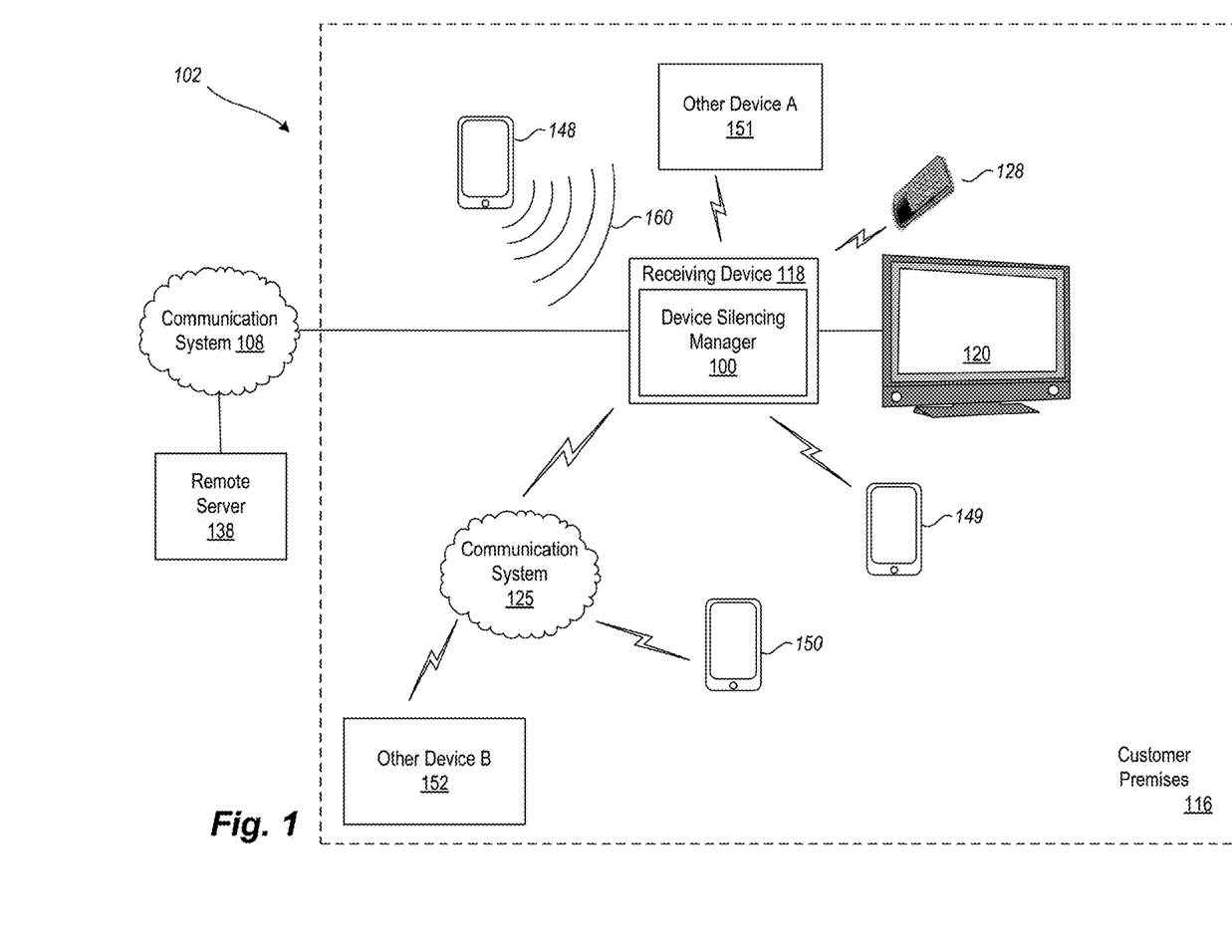
FIG. 1 is a block diagram illustrating an example environment in which embodiments of systems and methods for silencing devices may be implemented, according to an example embodiment.

FIG. 1 is a block diagram illustrating an example environment in which embodiments of systems and methods for silencing devices may be implemented, according to an example embodiment. Shown in FIG. 1 is a device silencing manager 100. A user may be watching television programming being received at the receiving device 118 on the display 120 at a volume level which makes it difficult to hear an audible notification, such as ringing of their telephone or mobile device 148 or an audio alert of an incoming message. The device silencing manager 100 of the receiving device 118 detects the ringing of the telephone or mobile device 148 or other type of audible alert and decides whether to cause a current audio level of the television programming to decrease such that the audible notification can be heard by the user. The audible notification may in some embodiments, be the incoming call or message itself, such as the voice or other live audio signal received on a two way radio transceiver, handheld transceiver ("walkie talkie"), baby monitor or the like that may occur without any other preliminary notification or alert.

The device silencing manager 100 may detect the audible notification occurring by receiving information regarding the audible notification. This information may be the sound waves 160 of the audible notification from the mobile device 148 picked up by a microphone of the receiving device 118. Additionally or alternatively, the information may be an electronic notification of the audible notification received either directly, such as from mobile device 149, or indirectly, such as from mobile device 150. If it is decided by the device silencing manager 100 to cause the current audio level of the television programming to decrease, then the device silencing manager 100 sends a signal, such as a command, causing the current volume level of the television programming being presented on the presentation device 120 to decrease or be muted. For example, this may be sending a volume control, mute or power signal from the device silencing manager 100 to the presentation device 120, which may have built in speakers for audio output.

A prompt may also be presented to the user on the presentation device 120 or mobile device 148 asking the user whether the audible notification is to be ignored. Based on a received response to this prompt to ignore the audible notification, the device silencing manager 100 may choose not to send the signal causing the current volume level of the television programming to decrease at all, or may choose to immediately restore the volume level to its previous level if such a signal had been sent already.

The device silencing manager 100 may also be in communication with and control the volume, power, and/or audio settings of other electronic devices and appliances that have current audible activity occurring to decrease or silence such activity in response to detecting the audible notification of an incoming contact. For example, the incoming contact may be an incoming call, an incoming message or other incoming contact being made by another party or device. In various embodiments, examples of such devices that may receive incoming contacts may be mobile device 148, mobile device 149, mobile device 150, other device A 151 and other device B 152. Before providing additional details regarding the operation and constitution of the device silencing manager 100, the environment 102 of the device silencing manager 100 will briefly be described.

In the environment 102, audio, video, and/or data service providers, such as, but not limited to, television service providers, provide their customers a multitude of TV programming. Such TV programming is often provided by use of a receiving device 118 communicatively coupled to a presentation device 120 configured to receive the TV programming. The receiving device 118 interconnects to one or more communications media or sources (such as a cable head-end, satellite antenna, telephone company switch, Ethernet portal, off-air antenna, or the like) that provide the TV programming through a communication system 108. The receiving device 118 commonly receives a plurality of TV programming on various TV channels by way of the communications media or sources, such as from remote server 138. Based upon selection by a user, the receiving device 118 processes and communicates the selected TV programming to the presentation device 120. For example, the receiving device 118 may be, or be part of, a device such as a television converter, set-top box, television receiving device, television recording device, satellite set-top box, satellite receiving device, cable set-top box, cable receiving device, media player, mobile device, smart phone, computer, tablet device, and/or television tuner. Accordingly, the receiving device 118 may be any suitable converter device or electronic equipment that is operable to receive or playback video or audio content.

Further, the receiving device 118 may itself include user interface devices, such as buttons or switches to provide user control of the receiving device and the functionalities described herein. In many applications, a remote-control device ("remote") 128 is operable to control the receiving device 118 and/or the presentation device 120. The remote 128 typically communicates with the receiving device 118 using a suitable wireless medium, such as infrared ("IR"), radio frequency ("RF"), or the like.

Examples of a presentation device 120 include, but are not limited to, a television ("TV"), a personal computer ("PC"), a sound system receiving device, a mobile device, a game system, or the like. Presentation devices 120 may employ a display, one or more speakers, and/or other output devices to communicate video and/or audio content to a user. In many implementations, one or more presentation devices 120 reside in or near a customer's premises 116 and are communicatively coupled, directly or indirectly, to the receiving device 118. Further, the receiving device 118 and the presentation device 120 may be integrated into a single device. Such a single device may have the above-described functionality of the receiving device 118 and the presentation device 120, or may even have additional functionality.

Communication system 108 may include many different types of communication media, now known or later developed. Non-limiting media examples include telephony systems; the Internet; internets; intranets; local area network ("LAN") systems; Internet Protocol (IP) systems; terrestrial television systems; digital terrestrial television (DTTV) systems; digital television terrestrial broadcasting (DTTB) systems; cable systems; fiber optic systems; microwave systems; asynchronous transfer mode ("ATM") systems; frame relay systems; digital subscriber line ("DSL") systems; Digital Video Broadcasting (DVB) systems over cable, satellite, terrestrial and mobile networks, including, but not limited to, Digital Video Broadcasting-Cable (DVB-C or DVB-C2), Digital Video Broadcasting-Satellite (DVB-S), Digital Video Broadcast-Satellite services to Handheld, (DVB-SH), Digital Video Broadcast-Return Satellite via Satellite (DVB-RCS), Digital Video Broadcasting-Terrestrial (DVB-T or DVB-T2), Digital Video Broadcasting-Handheld (DVB-H) and other variants; Direct-broadcast Satellite (DBS) systems; direct-to-home signals (DTH); Advanced Television Systems Committee (ATSC) systems; Digital Terrestrial Multimedia Broadcasting (DTMB) systems; Data Over Cable Service Interface Specification (DOCSIS) and EuroDOCSIS systems; and other radio frequency ("RF") systems and satellite systems.

Examples of customer premises 116 include a residence, a business, or any other suitable location operable to receive signals over communication system 108. The received signal is communicated, typically over a hard-wire connection, to the receiving device 118. The receiving device 118 converts the received signal into a signal and/or format suitable for communication to a presentation device 120 or another device, such as another digital video recorder or a home computing system.

The receiving device 118 may have one or more presentation interfaces to output the same or multiple services to one or multiple display devices, such as presentation device 120. The receiving device 118 may have a recording capability for subsequent presentation or forwarding. The receiving device 118 may have a network interface, such as the network connections 306 shown in FIG. 3, to forward a service to a remote presentation device for presentation or to a remote recording device for buffering.

In some embodiments, the receiving device 118 may be a digital receiving device with an Internet Protocol (IP) network interface that is similar to a digital receiver with a RF network interface, but it does not need the RF tuning and demodulation capability. Packets are received through the IP interface and are filtered to extract the elementary streams of the services to be received.

Other device A 151 and other device B 152 represent, at any given time, a device that is either generating an audible notification of an incoming call or message or a device that is to be silenced, or causes another device to be silenced, via the device silencing manager 100 while another device is generating an audible notification of an incoming call or message. For example, device A 151 and/or other device B 152 may be one or any combination of: a mobile device; a media device (e.g., any electronic device that receives and/or stores and plays video and/or audio); a receiving device (e.g., cable and/or satellite set-top box or a radio); a television, a digital versatile disk (DVD) player and/or recorder; a digital video recorder (DVR); a music player; a desktop computer; a mainframe computer; a server; a notebook computer; a tablet device; a video game console; an electronic game; a gaming device; an electronic educational device; an electronic children's toy; an electronic book reader; an entertainment system and/or device; a remote control device; a network appliance; a home appliance; a vacuum cleaner; a hair dryer; a dishwasher; a washing machine; a power tool; a power outlet; a smart power outlet; a security alarm; an office appliance; an air conditioning system; a fan; a range hood fan; a home security system device; a watch; a vehicle head unit, deck, stereo, navigation system and/or other electronic media system of a vehicle; a mobile communications and/or processing device having a handheld form factor (e.g., cellular phones, personal digital assistants or (PDAs), Blackberry® devices, iPhone® devices, Android® devices, smartphones, cellular enabled laptop computers, netbook computers and/or tablet devices); or the like.

In the illustrated example, the device silencing manager 100 operates upon the receiving device 118. When an audible notification is detected by the device silencing manager 100, it sends a signal to silence or reduce the audio level of one or more other devices that are in communication with the receiving device 118 such that the audible notification may be heard by the user. The communication of such information between the receiving device manager 100 and one or more other devices shown in FIG. 1 may be over a wired or wireless communication channel and/or may be communicated directly, such as over a peer-to-peer network or indirectly over another type of network. For example, communication system 125 may be made of or be built on one or a combination of various types of wired and/or wireless communication networks and/or connections. In one example embodiment, communication system 125 may include a short-range wireless, proximity based, or other types of wired or wireless connections between mobile device 150 receiving device 118 and other device 152, including, but not limited to, one or more of: a wireless point-to-point connection; a pairing network; a radio frequency identification (RFID) connection; a near field communication (NFC) connection; a Bluetooth® connection; a Universal Plug and Play (UPnP) connection; an Infrared Data Association (IrDA) connection according to the applicable IrDA specifications or applicable variations thereof; a wireless universal serial bus (USB) connection; a Z-Wave connection according to the ITU-T G.9959 specification or applicable variations thereof; a ZigBee connection according to the IEEE 802.15 specification or applicable variations thereof; a wireless home area network (HAN) connection (e.g., such as that based on the IEEE 802.11 specification or other applicable wireless standards); a wireless body area network connection (WBAN); a wireless personal area network (WPAN) connection; such as that based on the standard IEEE 802.15 specification or variations thereof; a Wi-Fi connection such as that based on IEEE 802.11 specification or variations thereof; and/or variations of such connections and applicable wireless protocol standards thereof.

The above description of the environment 102 and the customer premises 116, and the various devices therein, is intended as a broad, non-limiting overview of an example environment in which various embodiments of systems and methods for silencing devices may be implemented. FIG. 1 illustrates just one example of an environment 102 and the various embodiments discussed herein are not limited to such environments. In particular, environment 102 and the various devices therein, may contain other devices, systems and/or media not specifically described herein.

Example embodiments described herein provide applications, tools, data structures and other support to implement a device silencing manager 100 that facilitates silencing devices when one or more other devices are generating an audible notification of an incoming call or message. In the following description, numerous specific details are set forth, such as data formats, code sequences, and the like, in order to provide a thorough understanding of the described techniques. The embodiments described also can be practiced without some of the specific details described herein, or with other specific details, such as changes with respect to the ordering of the code flow, different code flows, and the like. Thus, the scope of the techniques and/or functions described are not limited by the particular order, selection, or decomposition of steps described with reference to any particular module, component, or routine.

Figure 2:
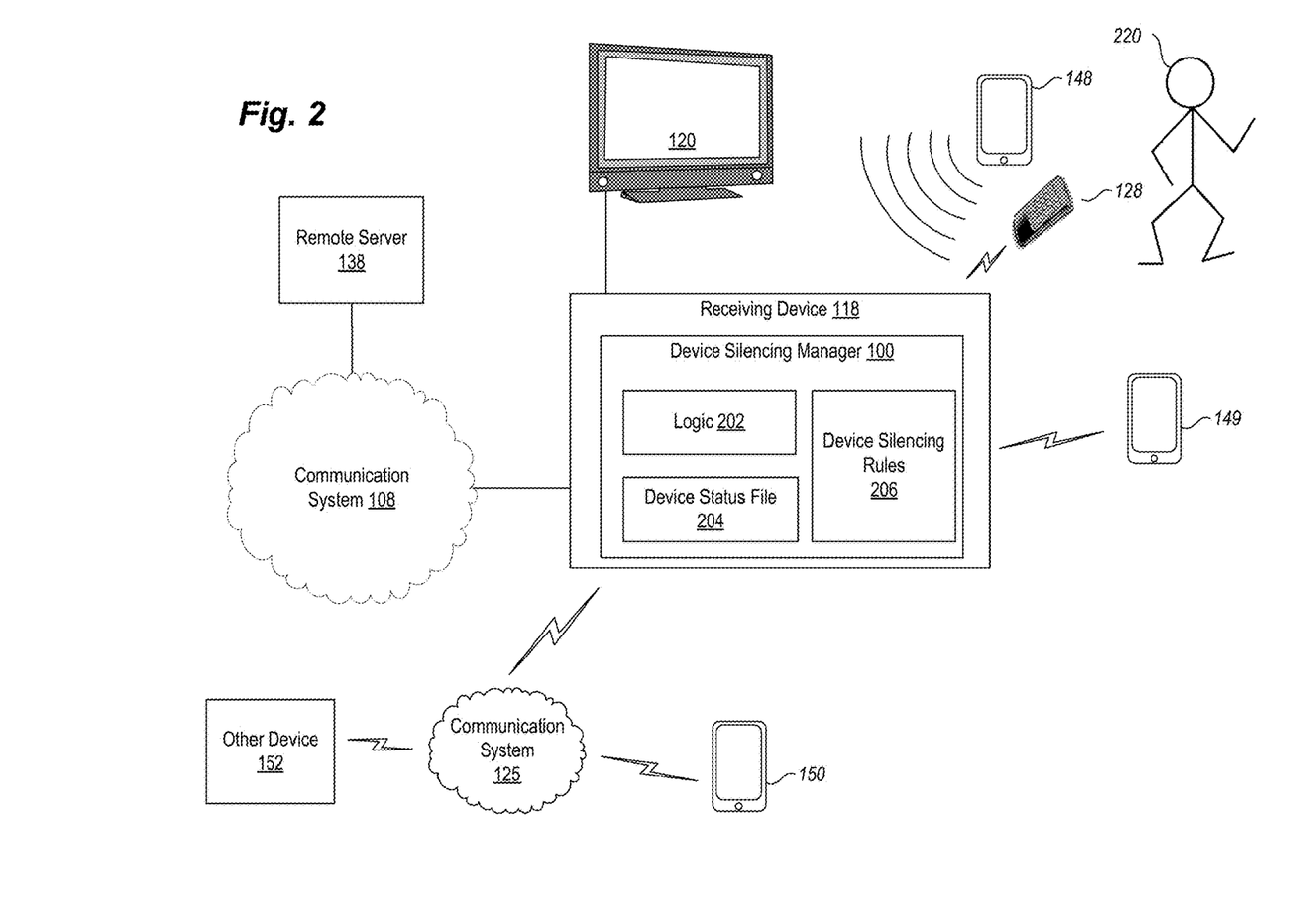
FIG. 2 is a block diagram illustrating example functional elements of a device silencing manager in a system for silencing devices, according to an example embodiment.

FIG. 2 is a block diagram illustrating example functional elements of a device silencing manager 100 in a system for silencing devices, according to an example embodiment. In particular, FIG. 2 shows an example device silencing manager 100 executing on an example receiving device 118. Receiving device 118 executing and/or otherwise utilizing logic 202 causes the device silencing manager 100 to perform the acts, functions, steps, and/or operations of the device silencing manager 100 described herein. The illustrated receiving device 118, which, for example, may be a set-top box, is communicatively coupled to a presentation device 120, to a remote server 138 via communication system 108, directly to a mobile device 149, indirectly to mobile device 150 and to other device 152. In various embodiments, there may be fewer or more devices in communication with the receiving device 118 than those shown in FIG. 2.

A user 220 may operate the receiving device 118 and/or the presentation device 120 using remote-control device 128 and/or the mobile device 148. In various embodiments, the mobile device 148 may be, but is not limited to, one or more of: a cellular telephone, another presentation device, a handheld computing device, a smart phone, a personal digital assistant (PDA), a tablet computing device, a notebook computing device, netbook computing device, a mobile gaming device, a handheld computer, a television remote control, etc. In some embodiments, the mobile device 148 may also or instead be and/or operate as a receiving device instead of or in conjunction with receiving device 118, and/or include the device silencing manager 100 and applicable components thereof. In some embodiments the functionality of the remote control 128 and the mobile device may instead be included in one device.

In some embodiments, the device silencing manager 100 receives information regarding an audible notification of an incoming call or message. Such an incoming call or message may be received at mobile device 148, mobile device 149, mobile device 150 and/or other device 152. Also, presentation device 118, mobile device 148, mobile device 149, mobile device 150, and/or other device 152, may in various embodiments be in use at any time and generating audio output being heard by user 220.

The device silencing manager 100 includes logic 202, a device status file 204, and device silencing rules 206 (or access thereto). The device status file 204 may include one or multiple files and may include information regarding the status of the presentation device 118, mobile device 148, mobile device 149, mobile device 150, other device 151 and/or other device 152. This information stored in the device status file 204 may be used by the device silencing manager 100. The device status file 204 may include, but is not limited to, for each device, information indicative of: whether the device is currently generating or about to generate an audible notification of an incoming call or message; is currently receiving an incoming call or message; a volume level or setting of the device; a current audio setting of the device; a current level of audio output of the device; a measurement of current audio output of the device (such as in decibels); a current location of the device; a location of the device relative to other devices; a priority level of an incoming call or message on the device; an indicator of who sent the incoming call or message to the device; device settings; device specifications; device codes; device owner identifiers; user profile identifiers associated with the device; device identifiers associated with the device; process identifiers associated with the device; application identifiers associated with the device; ringtone identifiers associated with the device; power signature identifiers associated with the device, user preferences, etc. Such information may be used by the device silencing manager in deciding whether to cause a current audio level of a device to decrease such that the audible notification being generated by another device can be heard by a user.

For example, device silencing manager may continuously, periodically or upon command, update the device status file 204 to indicate that one or more devices are currently outputting audio to be heard by user 220. If mobile device 150 starts to ring because of an incoming call, device silencing manager may detect this ringing by receiving a message from mobile device 150 through communication system 125 and then logic 202 will check the device status file 204 to determine which devices are currently outputting audio that may need to be silenced in order for the user to hear mobile device 150 ringing. If presentation device 120 is generating audio output as indicated in the device status file 204 when mobile device 150 starts to ring, then logic 202 may send a signal, such as a command, to presentation device 120 to mute or turn down the volume of the audio output. Logic 202 may also or instead send a signal, such as a command, to another device to mute or turn down the volume of the audio output of the other device, or send a command to power-down or change the operational state to a less noisier condition such as a hair dryer may have 3 fan settings for maximum to minimum air flow which also affects the loudness of the device. For example, this command may be sent to other device 150 via network 125 from receiving device 118.

Rules indicating when and in what circumstances to silence a device when another device is generating an audible notification of an incoming call or message may be stored as part of the device silencing rules 206 and accessed by the logic 202 to implement the device silencing manager 100. For example, device silencing rules 206 may include a rule that the presentation device 120 is only to be silenced when an incoming call is being received from a particular person, or from a person that is a member of a particular group or category. Device silencing rules 206 may include a rule that presentation device 120 is only to be silenced when a particular television show or shows are, or are not, playing; when particular individuals are logged in to receiving device 118; or to only silence particular devices, such as silencing a networked hairdryer or vacuum cleaner, but not the presentation device 120 when another device is generating an audible notification of an incoming call or message.

Device silencing rules 206 may include a rule that a device is to be silenced only when another device 148 generates, or does not generate, a particular ringtone as the audible notification of an incoming call or message. Furthermore, device silencing rules 206 may include rules that are based on the current location of one or more devices within customer premises 116, locations of devices with respect to each other and/or locations of devices with respect to user 220. For example, device status file 204 may include information indicative of a current location of the devices shown in FIG. 2 and user 220, who may have a wearable device. This information may be received by the receiving device 118 via global positioning system (GPS) data associated with each device, beacon data received from each device, electronic tags associated with each device, proximity based network data associated with each device, proximity based network (Bluetooth®) triangulation, and/or Wi-Fi triangulation, etc.

For example, the device silencing rules 206 may include rules that the presentation device 120 need not be silenced in certain situations, such as if the device generating the an audible notification of an incoming call or message, mobile device 150, for example, is over a particular distance from the presentation device 120 or user 220. Other rules may require the device to be over a particular distance from the presentation device 120, or from user 220, in order for the presentation device 120 to be silenced, such that those devices which are far away may be heard more easily by user 220 and since the user could instead see a visual indication of the incoming call if the device was close, or feel the vibration of the device if the user was carrying the device in their hand or pocket. The rules could also work in the opposite, such as to silence the device 148 generating an audible notification of an incoming call or message when the presentation device 120 is on or generating audio output. This may be useful in situations where the presentation device 120 is being used in meetings or movie theaters.

The other device 152 may be a smart power outlet that receives a command from the device silencing manager 100 to cut power to or otherwise cause devices plugged into it to turn off when an audible notification of an incoming call or message is being received on another device, such as mobile device 150. For example, if user 220 is using a hair dryer plugged into a smart power outlet represented by other device 152, and receives an incoming call on device 150, then logic 202 will cause device silencing manager 100 to send a command to smart power outlet represented by other device 152 to switch off power such that the hairdryer will cease operation. In this embodiment, the hairdryer need not have any device networking or communication functionality.

In some embodiments, the receiving device 118 recognizes which types of devices are plugged into the smart power outlet represented by other device 152 and only sends a command for the smart power outlet represented by other device 152 to switch off for particular types of devices (e.g., particularly noisy devices) that are plugged into it according to device silencing rules 206. For example, device status file 204 may have the power signatures stored of particular devices that are to be silenced. The power signature of the device plugged in to the smart power outlet represented by other device 152 may be communicated over communication system 125 to the receiving device 118. This may in response to a periodic polling by the device silencing manager 100 of the smart power outlet represented by other device 152, in response to a device being plugged in to the smart power outlet represented by other device 152, or requested by device silencing manager in response to another device generating an audible notification of an incoming call or message. Also, such communications may be made over the power lines of customer premises 116, which may be, or form part of, communication system 125. The logic 202 of the device silencing manager 100 then compares this received power signature to the stored power signatures in the device status file 204 and, if it matches one of the stored power signatures in the device status file 204, then the logic 202 will cause the device silencing manager 100 to send a command via communication system 125 to the smart power outlet represented by other device 152 to switch off according to the rule in the device silencing rules 206. This same or similar process may be performed for all such power outlets and devices plugged in to them on customer premises 116 when the device silencing manager 100 detects an audible notification of an incoming call or message on a device.

Such rules may also be used in combination with other rules based on the current distance of the devices from each other or from the user 220. For example, there may be a rule in the device silencing rules 206 that a hairdryer plugged in to the third story outlet of the customer premises 116 need not be silenced when the device receiving the incoming call is currently located in the basement, or otherwise out of range of being heard by user 220 anyway. In addition to or instead of silencing devices, other actions may be taken according to device silencing rules 206 when another device is generating an audible notification of an incoming call or message. These may include, but are not limited to, displaying or sending alerts regarding the incoming call or message, such as displaying an alert on presentation device 120 or sending a message to another device, thus altering user 220 that an incoming call or message is being received.

Additionally, the device silencing rules 206 may include rules that give priority to particular devices that are to be heard over other devices. For example, if an audible notification of an incoming call or message is being generated on mobile device 148 and on mobile device 149, the device silencing rules 206 may indicate priority is to be given to mobile device 148 and thus the device silencing manager 100 will send a command to silence device 149 and any other devices currently generating audio output that are lower priority according to the device silencing rules 206. The device silencing rules may also be based on the loudness of the audible notification of the incoming call or message and the loudness of the audible activity being generated by the device to be potentially silenced. For example, the device silencing rules 206 may indicate that the silencing command is to be sent only when the loudness of the audible notification of the incoming call or message is lower than the loudness level of the audible activity being generated by the device to be potentially silenced. These rules may take into consideration the difference in these loudness levels such that the audible notification of the incoming call may be heard over the other audible activity being generated by the device to be potentially silenced. Furthermore, the device to be potentially silenced may, in some embodiments, not be completely silenced, but will only be silenced to the extent such that the audible notification of the incoming call or message may be heard over the other device. These rules may be based on a comparison of the audio levels or settings of the respective devices or based on the actual sound waves detected by microphones of the receiving device 118.

Figure 3:
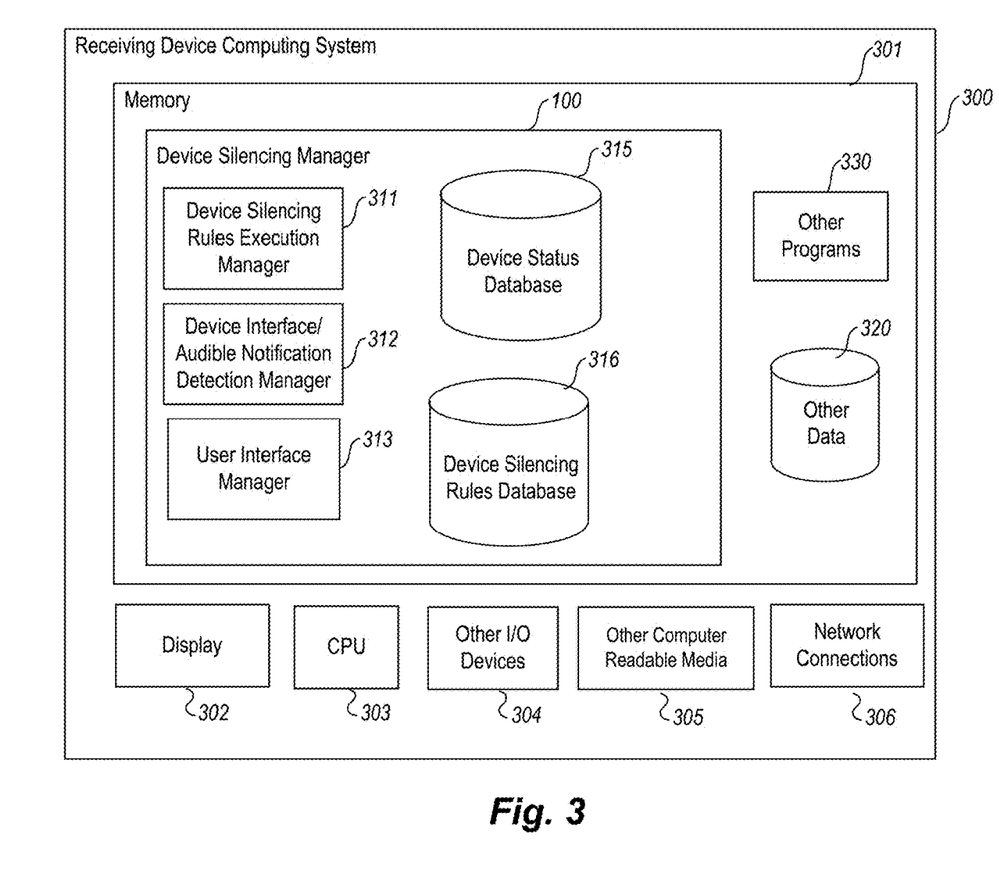
FIG. 3 is a block diagram of a computing system for practicing example embodiments of systems and methods for silencing devices, according to an example embodiment.

FIG. 3 is a block diagram of a computing system 300 for practicing example embodiments of systems and methods for silencing devices, according to an example embodiment. FIG. 3 shows a receiving device computing system 300 that may be utilized to implement a device silencing manager 100. In one embodiment, the receiving device computing system 300 is part of a set-top box configured to receive, buffer, record and/or display programming on a presentation device 120, such as that shown in FIG. 3. In other embodiments, the receiving device computing system 300 is part of a presentation device, such as a television or a mobile device.

Note that one or more general purpose or special purpose computing systems/devices may be used to implement the device silencing manager 100. In addition, the computing system 300 may comprise one or more distinct computing systems/devices and may span distributed locations. Furthermore, each block shown may represent one or more such blocks as appropriate to a specific embodiment or may be combined with other blocks. Also, the device silencing manager 100 may be implemented in software, hardware, firmware, or in some combination to achieve the capabilities described herein.

In the embodiment shown, receiving device computing system 300 comprises a computer memory ("memory") 301, a user interface display 302, one or more Central Processing Units ("CPU") 303, Input/Output devices 304 (e.g., keyboard, mouse, RF or infrared receiving device, CRT or LCD display, and the like), other computer-readable media 305, and network connections 306. As mentioned above, the receiving device 118 may receive programming from an antenna, and/or partially from, or entirely from, another source such as remote server 138. The software or firmware comprising the device silencing manager 100 may also be downloaded from and/or or updated from remote server 138. Network connections 306 represent the interfaces, tuners, receivers, transceivers, wireless radios, demodulators, demultiplexers, packet filters, network equipment, etc., of the receiving device 118 that are configured and operable to receive data from and interface with the devices and other sources described herein, and convert the received signal(s) from these sources into a signal and/or format suitable for communication to the device silencing manager 100, to presentation device 120 and/or to another device.

The device silencing manager 100 is shown residing in memory 301. In other embodiments, some portion of the contents and some of or all of the components of the device silencing manager 100 may be stored on and/or transmitted over the other computer-readable media 305. The components of the device silencing manager 100 execute on one or more CPUs 303 and cause the operation of the device silencing manager 100 to perform as described herein.

Other code or programs 330 (e.g., an audio/video processing module, a TV program guide manager module, a Web server, and the like) and potentially other data repositories, such as device status database 315 and device silencing rules database 316, also reside in the memory 301, and are accessible by one or more CPUs 303. Of note, one or more of the components in FIG. 3 may not be present in any specific implementation. For example, some embodiments may not provide other computer readable media 305 or a display 302 and the device status database 315 and device silencing rules database 316 may be located at a remote server 138 accessible by the device silencing manager via network connections 306.

In some embodiments, the device silencing manager 100 may include a device silencing rules execution manager 311, a device interface/audible notification detection manager 312 and a user interface manager 313. Other and/or different modules may be implemented. The device silencing manager 100 may interact via a network 350 with other devices such as those shown in FIG. 1 and FIG. 2. The device silencing rules execution manager 311 provides the rules execution functions of the device silencing manager 100. The device interface/audible notification detection manager 312 provides the functionality as described herein to interface with and detect the audible notifications of an incoming calls or messages on devices such as those shown in FIG. 1 and FIG. 2.

The user interface manager 313 provides a view and a controller that facilitate user interaction with the device silencing manager 100 and its various components. For example, the user interface manager 313 provides a graphical user interface for the user of the receiving device computing system 300 to configure the settings of, maintain and operate the device silencing manager 301. For example, the user may define the device silencing rules 206 stored in the device silencing rules database 316, which are used by the device silencing manager 100 as described herein. Also, the user interface manager 313 provides interactive graphical user interface screens and/or elements to notify the user of when an audible notification of an incoming call or message is being generated. Additionally, in some embodiments, there is an option for the user to communicate to the receiving device 118 which devices to silence and under what circumstances they should be silenced when an audible notification of an incoming call or message is being received on another device as described herein.

In some embodiments, the device silencing manager 100 includes an application program interface ("API") that provides programmatic access to one or more functions of the device silencing manager 100. For example, such an API may provide a TV programmatic interface to one or more functions of the device silencing manager 100 that may be invoked by one of the other programs 330 or some other module. In this manner, the API may facilitate the development of third-party software, such as user interfaces, plugins, adapters (e.g., for integrating functions of the device silencing manager 100 into desktop applications and mobile device applications), and the like. In addition, the API may be in at least some embodiments invoked or otherwise accessed via remote entities, such as the remote server 138 (shown in FIG. 1 and FIG. 2) or another device shown in FIG. 1 or FIG. 2, to access various functions of the device silencing manager 100. For example, an application running on mobile device 149 may send a notification to the device silencing manager 100 that an audible notification of an incoming call or message is occurring on device 149, causing the device silencing manager 100 to silence the presentation device 120.

In an example embodiment, components/modules of the device silencing manager 100 are implemented using standard programming techniques. For example, the device silencing manager 100 may be implemented as a "native" executable running on the CPU 303, along with one or more static or dynamic libraries. In other embodiments, the device silencing manager 100 may be implemented as instructions processed by a virtual machine that executes as one of the other programs 330. In general, a range of programming languages known in the art may be employed for implementing such example embodiments, including representative implementations of various programming language paradigms, including but not limited to, object-oriented (e.g., Java, C++, C#, Visual Basic.NET, Smalltalk, and the like), functional (e.g., ML, Lisp, Scheme, and the like), procedural (e.g., C, Pascal, Ada, Modula, and the like), scripting (e.g., Perl, Ruby, Python, JavaScript, VBScript, and the like), declarative (e.g., SQL, Prolog, and the like).

In a software or firmware implementation, instructions stored in a memory cause, when executed, one or more processors of the computing system 300 to perform the functions of the device silencing manager 100. For example, instructions stored in memory when executed by a computer processor modify the data in the same or another memory address space, thus performing the functions of the device silencing manager 100. Alternatively instructions stored in memory when executed by a processor could modify the control registers of application specific integrated circuit (ASIC) to configure it to perform the functions of the device silencing manager 100, and/or it could modify the control registers of a different ASIC to configure it to perform the function of the device silencing manager 100. Such an ASIC may directly access and modify the memory of the computer processor without the intervention of the computer processor (a direct memory access (DMA) operation). In one embodiment, instructions, when executed, cause the CPU 303 or some other processor to detect that the audible notification is occurring and send a signal to cause the current audio level of a device to decrease based on the detection, by initiating a suitable DMA operation, or the like. Similarly, the CPU 303 or other processor may be configured to perform other operations such as deciding whether to cause a current audio level of a device to decrease such that the audible notification can be heard by a user.

The embodiments described above may also use synchronous or asynchronous client-server computing techniques. However, the various components may be implemented using more monolithic programming techniques as well, for example, as an executable running on a single CPU computer system, or alternatively decomposed using a variety of structuring techniques known in the art, including but not limited to, multiprogramming, multithreading, client-server, or peer-to-peer, running on one or more computer systems each having one or more CPUs. Some embodiments may execute concurrently and asynchronously, and communicate using message passing techniques. Equivalent synchronous embodiments are also supported by a device silencing manager implementation. Also, functions could be implemented and/or performed by each component/module, and in different orders, and by different components/modules, yet still achieve the functions of the device silencing manager 100 described herein. For example, a one way (broadcast) and/or two-way (interactive) local area networks (LAN) may be used for communication between the device silencing manager 100 and other devices receiving an incoming call or message or other devices to be potentially silenced. Both types of networks may use storage local to the receiving device and under local control on the local area network (LAN).

In addition, programming interfaces to the data stored as part of the device silencing manager 100, such as in the device status database 315 and device silencing rules database 316, can be available by standard mechanisms such as through C, C++, C#, and Java APIs; libraries for accessing files, databases, or other data repositories; through scripting languages such as XML; or through Web servers, FTP servers, or other types of servers providing access to stored data. The device status database 315 and device silencing rules database 316 may be implemented as one or more database systems, file systems, or any other technique for storing such information, or any combination of the above, including implementations using distributed computing techniques.

Different configurations and locations of programs and data are contemplated for use with techniques described herein. A variety of distributed computing techniques are appropriate for implementing the components of the illustrated embodiments in a distributed manner including but not limited to TCP/IP sockets, RPC, RMI, HTTP, Web Services (XML-RPC, JAX-RPC, SOAP, and the like). Other variations are possible. Also, other functionality could be provided by each component/module, or existing functionality could be distributed amongst the components/modules in different ways, yet still achieve the functions of a device silencing manager.

Furthermore, in some embodiments, some or all of the components of the device silencing manager 100 may be implemented or provided in other manners, such as at least partially in firmware and/or hardware, including, but not limited to one or more application-specific integrated circuits ("ASICs"), standard integrated circuits, controllers (e.g., by executing appropriate instructions, and including microcontrollers and/or embedded controllers), field-programmable gate arrays ("FPGAs"), complex programmable logic devices ("CPLDs"), and the like. Some or all of the system components and/or data structures may also be stored as contents (e.g., as executable or other machine-readable software instructions or structured data) on, or transmitted/communicated by, various non-transitory or transitory computer-readable mediums (e.g., as a hard disk; a memory; a computer network or cellular wireless network or other data transmission medium; or a portable media article to be read by an appropriate drive or via an appropriate connection, such as a DVD or flash memory device) so as to enable or configure the computer-readable medium and/or one or more associated computing systems or devices to execute or otherwise use or provide the contents to perform at least some of the described techniques. Some or all of the system components and data structures may also be stored as data signals (e.g., by being encoded as part of a carrier wave or included as part of an analog or digital propagated signal) on a variety of computer-readable transmission mediums, which are then transmitted, including across wireless-based and wired/cable-based mediums, and may take a variety of forms (e.g., as part of a single or multiplexed analog signal, or as multiple discrete digital packets or frames). Such computer program products may also take other forms in other embodiments. Accordingly, embodiments of this disclosure may be practiced with other computer system configurations.

Figure 4:
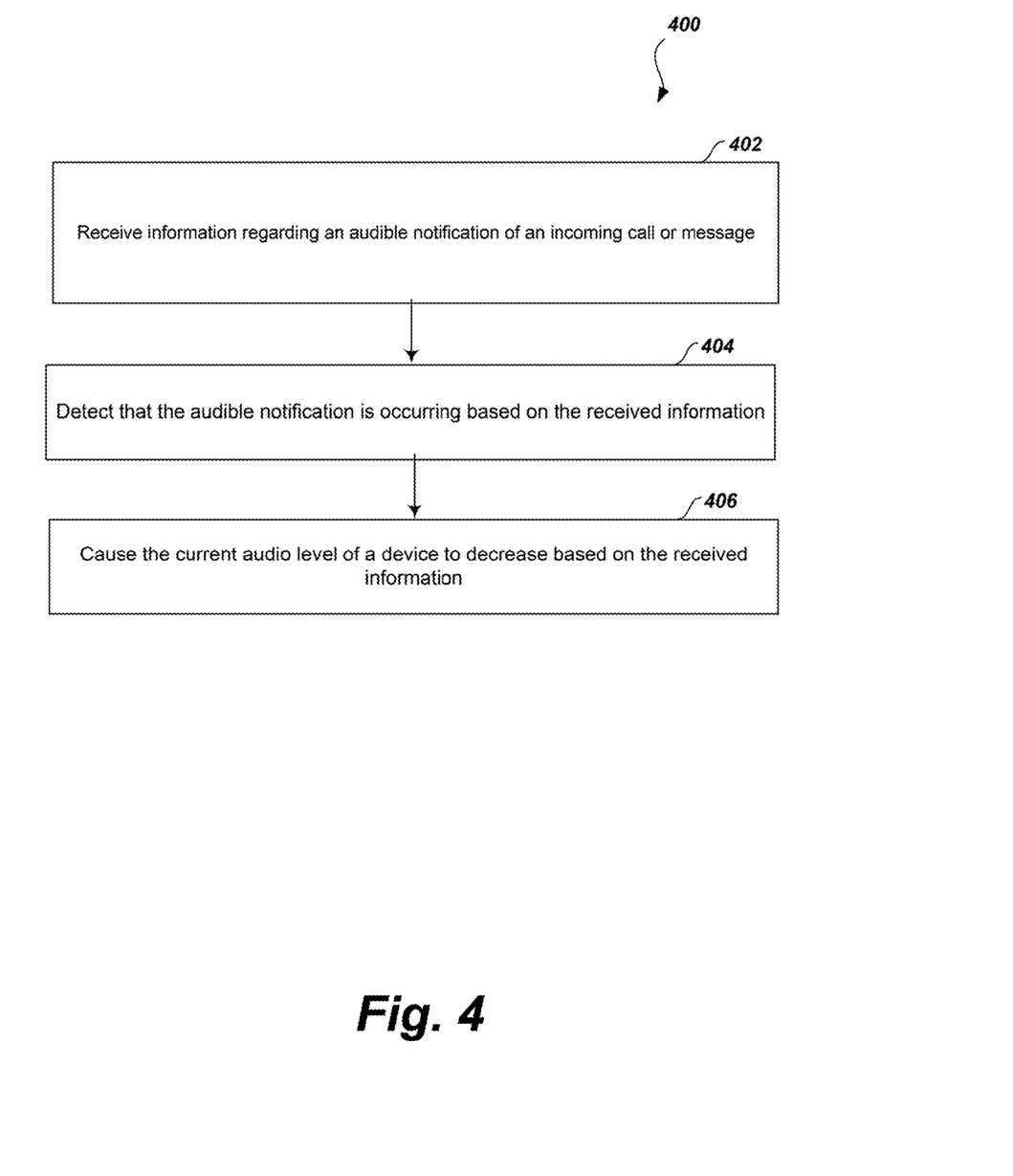
FIG. 4 is a flow diagram of first example method for silencing devices, according to an example embodiment.

FIG. 4 is a flow diagram of first example method 400 for silencing devices, according to an example embodiment. For example, the method 400 may be performed by one or more modules/components of the device silencing manager 100 executing on the receiving device 118, as described with respect to FIGS. 1 through 3.

At 402, the receiving device 118 receives information regarding an audible notification of an incoming call or message.

At 404, the receiving device 118 detects that the audible notification is occurring based on the received information.

At 406, the receiving device 118 causes the current audio level of a device to decrease based on the received information.

Figure 5:
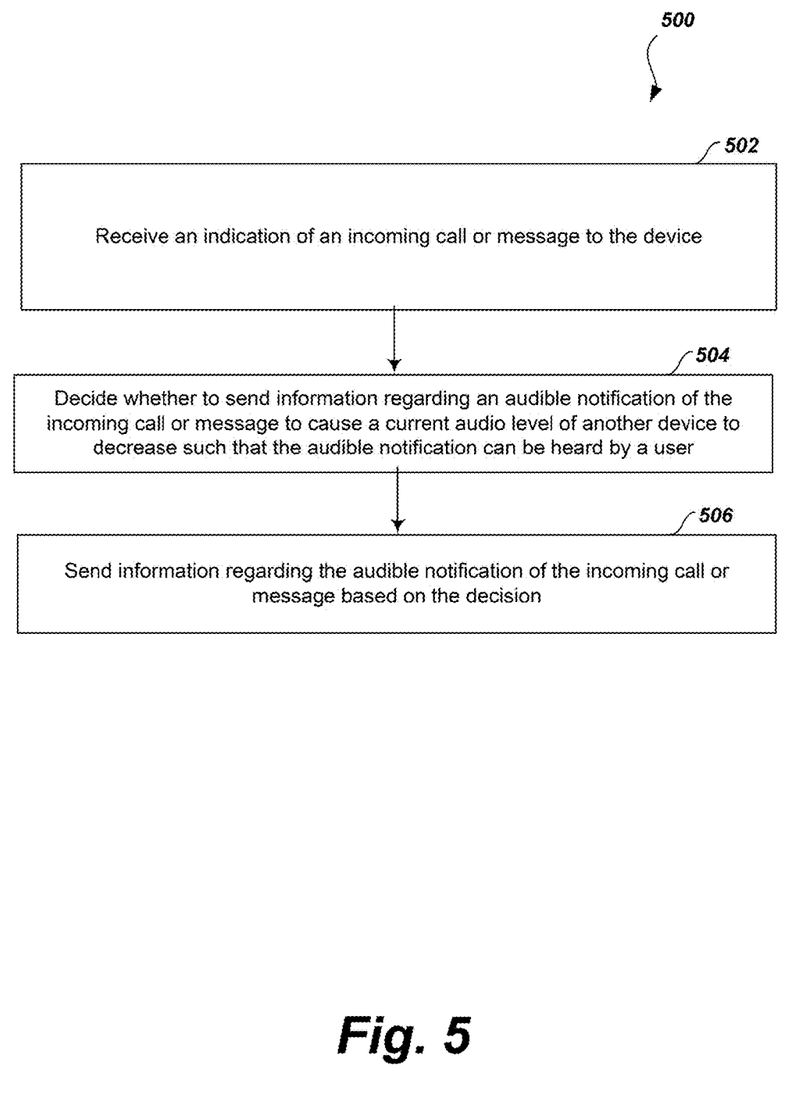
FIG. 5 is a flow diagram of second example method for silencing devices, according to an example embodiment.

FIG. 5 is a flow diagram of second example method 500 for silencing devices, according to an example embodiment. For example, the method 500 may be performed by one or more modules/components of the device 148, as described with respect to FIGS. 1 through 3.

At 502, the device 148 receives an indication of an incoming call or message to the device.

At 504, in response to receiving the indication of an incoming call or message to the device, the device 148 decides whether to send information regarding an audible notification of the incoming call or message to cause a current audio level of another device to decrease such that the audible notification can be heard by a user.

At 506, if it was decided to send information regarding the audible notification of the incoming call or message, the device 148 sends the information regarding the audible notification of the incoming call or message.

Figure 6:
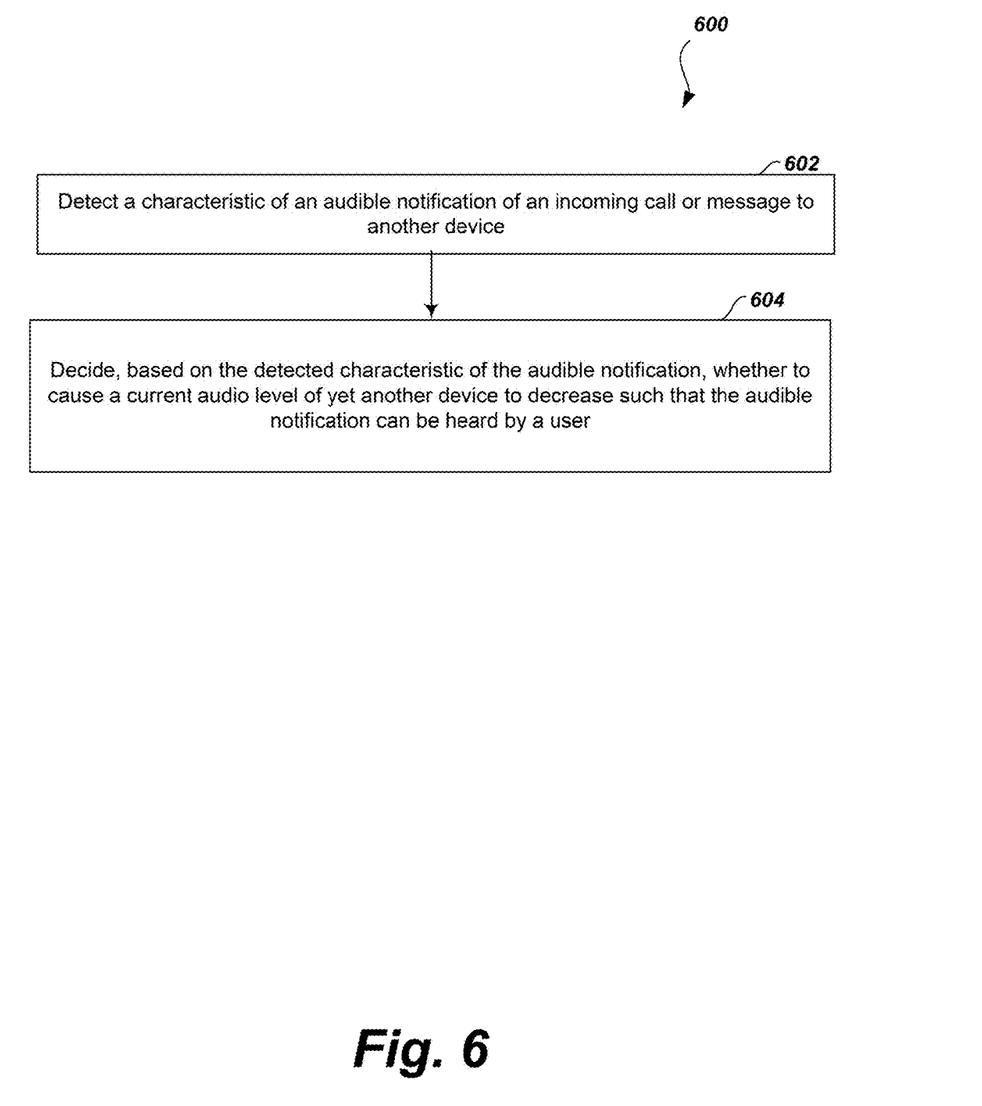
FIG. 6 is a flow diagram of third example method for silencing devices, according to an example embodiment.

FIG. 6 is a flow diagram of third example method 600 for silencing devices, according to an example embodiment. For example, the method 600 may be performed by one or more modules/components of the receiving device 118, as described with respect to FIGS. 1 through 3.

At 602, the receiving device 118 detects a characteristic of an audible notification of an incoming call or message to another device.

At 604, the receiving device 118 decides, based on the detected characteristic of the audible notification, whether to cause a current audio level of yet another device to decrease such that the audible notification can be heard by a user.

The invention claimed is:

1. A method in a device silencing manager system, the method comprising:
receiving, by at least one computer processor that is in control of the device silencing manager system, information regarding an audible notification of an incoming contact;
detecting, by the at least one computer processor, that the audible notification is occurring based on the received information;
in response to the detection that the audible notification is occurring, deciding, by the at least one computer processor, whether to cause a current audio level of a device to decrease, wherein the deciding to cause a current audio level of the device to decrease includes:
receiving, by at least one computer processor that is in control of the device silencing manager system, information indicative of current audible activity of the device;
in response to the detecting that the audible notification is occurring, receiving, by at least one computer processor that is in control of the device silencing manager system, a power signature of the device;
comparing, by at least one computer processor that is in control of the device silencing manager system, the received power signature to a plurality of stored power signatures of devices which are to have their audio levels decreased in response to the detecting that the audible notification is occurring;
determining, by at least one computer processor that is in control of the device silencing manager system, whether the received power signature matches one of the plurality of stored power signatures; and
in response to the power signature matching one of the plurality of stored power signatures, deciding, by at least one computer processor that is in control of the device silencing manager system, to cause the current audio level of the device to decrease; and
causing, by the at least one computer processor, the current audio level of the device to decrease based on the decision.

2. The method of claim 1 wherein the device is an electronic device selected from the group comprising of: a television, a speaker, a sound system, a stereo, a radio, earphones, a mobile device, an electronic toy, an electronic game, a computer and a gaming system.

3. The method of claim 1 wherein the device silencing manager system is in a receiving device.

4. The method of claim 3 wherein the receiving device is a set top box.

5. The method of claim 1 wherein the audible notification is an audible notification of an incoming call on a cellular telephone.

6. The method of claim 5 wherein the audible notification is a telephone ring.

7. The method of claim 5 wherein receiving the information regarding the audible notification of an incoming contact includes receiving, at a microphone, the audible notification of the incoming call from the cellular telephone.

8. The method of claim 7 wherein detecting that the audible notification is occurring based on the received information includes identifying the audible notification from other ambient noise.

9. The method of claim 5 wherein receiving the information regarding the audible notification of an incoming contact includes receiving an indication electronically from the cellular telephone that the cellular telephone is generating the audible notification of the incoming call.

10. The method of claim 1 wherein deciding whether to cause a current audio level of the device to decrease includes:
detecting a characteristic of the audible notification; and
deciding, based on the detected characteristic of the audible notification, whether to cause a current audio level of the device to decrease.

11. The method of claim 10 wherein deciding whether to cause a current audio level of the device to decrease based on the detected characteristic of the audible notification includes:
verifying whether the detected characteristic of the audible notification is in a database of stored characteristics for which priority is to be given for the user to hear audible notifications associated with one or more of the stored characteristics; and if it is verified that the detected characteristic of the audible notification is in the database of stored characteristics, then deciding to cause the current audio level of the device to decrease.

12. The method of claim 11 wherein the detected characteristic of the audible notification is a type of ringtone.

13. The method of claim 11 wherein the detected characteristic of the audible notification is indicative of an identity of a party who sent the incoming contact.

14. The method of claim 1 wherein the device for which the audio level is to be decreased is an electrical appliance.

15. The method of claim 14 wherein the electrical appliance is selected from the group comprising: a vacuum cleaner, a hair dryer, a dishwasher, a washing machine, and a power tool.

16. The method of claim 1 wherein the audible notification is an audible notification of an incoming message.

17. The method of claim 1 wherein causing the current audio level of a device to decrease based on the decision includes:

receiving, by at least one computer processor that is in control of the device silencing manager system, information indicative of current audible activity of the device; and if it was decided to cause the current audio level of the device to decrease, sending a signal that initiates the causing of the current audio level of the device to decrease based on the information indicative of the current audible activity of the device.

18. The method of claim 17 wherein the signal that initiates the causing of the current audio level of the device to decrease is a signal that causes the device to turn off.

19. The method of claim 17 wherein the signal that initiates the causing of the current audio level of the device to decrease is a signal that causes one or more of: a volume setting of the device to change and an audio setting of the device to change.

20. The method of claim 17 wherein the signal that initiates the causing of the current audio level of the device to decrease is a signal that causes a power outlet in which the device is plugged to switch off.

21. The method of claim 17 wherein the information indicative of current audible activity of the device is a power signature of a device associated with noisy operation from a power outlet in which the device is plugged.

22. The method of claim 17, further comprising:

polling the device to receive the information indicative of current audible activity of the device and wherein the receiving information indicative of current audible activity of the device is in response to the polling and includes receiving the information indicative of current audible activity of the device wirelessly from the device over a network.

23. The method of claim 17, wherein sending of the signal that initiates the causing of the current audio level of the device to decrease includes sending the signal over a wireless network to the device.

24. The method of claim 1 wherein the deciding whether to cause a current audio level of the device to decrease includes:

determining a proximity of the device to a device that is generating the audible notification; and deciding, based on the determined proximity, whether to cause a current audio level of the device to decrease.

25. A device comprising:

at least one processor; and at least one non-transitory computer readable storage medium coupled to the at least one processor having computer executable instructions stored thereon that, when executed cause at least one processor to:

receive an indication of an incoming contact to the device; and in response to receiving the indication of an incoming contact to the device:

generate an audible notification of the incoming contact;

decide whether to send information regarding the audible notification of the incoming contact to cause a current audio level of another device to decrease by at least causing the at least one processor to:

receive information indicative of current audible activity of the other device;

receive a power signature of the other device;

compare the received power signature to a plurality of stored power signatures of devices which are to have their audio levels decreased in response to the detecting that the audible notification is occurring;

determine whether the received power signature matches one of the plurality of stored power signatures; and in response to the power signature matching one of the plurality of stored power signatures, decide to send information regarding the audible notification of the incoming contact to cause a current audio level of the other device to decrease; and send the information regarding the audible notification of the incoming contact.

26. The device of claim 25 wherein sending the information regarding the audible notification of the incoming contact includes sending the information to a set top box that is in communication with the other device.

27. The device of claim 25 wherein sending the information regarding the audible notification of the incoming contact includes sending the information to the other device.

28. The device of claim 25 wherein deciding whether to send information regarding the audible notification of the incoming contact to cause the current audio level of the other device to decrease is based on an identity of a party who sent the incoming contact.

29. A non-transitory computer-readable storage medium having computer executable instructions thereon that, when executed by at least one computer processor, cause at least one computer processor to:

detect a characteristic of an audible notification of an incoming contact to a device; and decide, based on the detected characteristic of the audible notification, whether to cause a current audio level of another device to decrease, wherein the deciding whether to cause a current audio level of the other device to decrease includes:

receiving information indicative of current audible activity of the other device;

receiving a power signature of the other device;

comparing the received power signature to a plurality of stored power signatures of devices which are to have their audio levels decreased;

determining whether the received power signature matches one of the plurality of stored power signatures; and deciding whether to cause a current audio level of the other device to decrease additionally based on the determination whether the received power signature matches one of the plurality of stored power signatures.

30. The non-transitory computer-readable storage medium of claim 29 wherein the computer executable instructions stored thereon, when executed by at least one computer processor, further cause at least one computer processor to:

cause the current audio level of the other device to decrease based on the decision.

31. The non-transitory computer-readable storage medium of claim 29, wherein deciding whether to cause a current audio level of another device to decrease includes:

verifying whether the detected characteristic of the audible notification is in a database of stored characteristics for which priority is to be given for the user to hear audible notifications associated with one or more of the stored characteristics; and if it is verified that the detected characteristic of the audible notification is in the database of stored characteristics, then deciding to cause the current audio level of the other device to decrease.

32. The non-transitory computer-readable storage medium of claim 29, wherein deciding whether to cause a current audio level of another device to decrease is based on a proximity of the device to the other device.

33. The method of claim 1 further comprising, in response to the power signature matching one of the plurality of stored power signatures, sending a textual alert indicating the incoming contact.

\* \* \* \* \*